US012084583B2

(12) United States Patent
Pujari et al.

(10) Patent No.: US 12,084,583 B2
(45) Date of Patent: Sep. 10, 2024

(54) DIELECTRIC INK COMPOSITION

(71) Applicant: Alpha Assembly Solutions Inc., Waterbury, CT (US)

(72) Inventors: Narahari Pujari, Bangalore (IN); Jayaprakash Sundaramurthy, Bangalore (IN); Siuli Sarkar, Bangalore (IN); Ravindra M. Bhatkal, East Brunswick, NJ (US)

(73) Assignee: Alpha Assembly Solutions Inc., Waterbury, CT (US)

( * ) Notice: Subject to any disclaimer, the term of this patent is extended or adjusted under 35 U.S.C. 154(b) by 480 days.

(21) Appl. No.: 17/524,891

(22) Filed: Nov. 12, 2021

(65) Prior Publication Data
US 2022/0064466 A1    Mar. 3, 2022

Related U.S. Application Data

(63) Continuation of application No. 16/613,344, filed as application No. PCT/US2018/032503 on May 14, 2018, now Pat. No. 11,193,031.
(Continued)

(51) Int. Cl.
*C09D 11/322*    (2014.01)
*B41F 15/40*    (2006.01)
(Continued)

(52) U.S. Cl.
CPC ............ *C09D 11/322* (2013.01); *B41F 15/40* (2013.01); *B41M 5/0023* (2013.01);
(Continued)

(58) Field of Classification Search
CPC ...... C09D 11/322; C09D 11/037; C09D 11/52; C09D 11/10; C09D 11/101; C09D 11/102;
(Continued)

(56) References Cited

U.S. PATENT DOCUMENTS 5,607,744 A    3/1997 Diener et al.
7,893,138 B2    2/2011 Shelton et al.
(Continued)

FOREIGN PATENT DOCUMENTS

CN    103224735 B    11/2014
EP    0589241 A2    3/1994
(Continued)

OTHER PUBLICATIONS

International Search Report of the International Searching Authority for PCT/US2018/032503 with mailing date of Aug. 8, 2018.

*Primary Examiner* — Thinh H Nguyen
(74) *Attorney, Agent, or Firm* — Stinson LLP

(57) ABSTRACT

The present invention relates to flexible and stretchable UV and thermally curable dielectric ink compositions that can be thermo or vacuum formed. The flexible ink can form a stretchable dielectric coating having excellent adhesion. The dielectric ink compositions can be applied on a circuit board, such as a paper-phenolic resin board, plastic board (PMMA, PET or the like) or a glass-epoxy resin board, by screen printing or the like, followed by heat/UV curing. The compositions are suitable for use in applications such as a capacitive touch, in-mold forming, creating cross over insulation layers, and manufacturing electronic circuitry and devices.

22 Claims, 3 Drawing Sheets

Related U.S. Application Data

(60) Provisional application No. 62/506,095, filed on May 15, 2017.

(51) Int. Cl.
| | |
|---|---|
| *B41M 5/00* | (2006.01) |
| *C09D 11/037* | (2014.01) |
| *C09D 11/101* | (2014.01) |
| *C09D 11/102* | (2014.01) |
| *C09D 11/104* | (2014.01) |
| *C09D 11/107* | (2014.01) |
| *C09D 11/38* | (2014.01) |
| *H05K 1/03* | (2006.01) |
| *H05K 3/00* | (2006.01) |
| *C09D 11/30* | (2014.01) |

(52) U.S. Cl.
CPC .......... *C09D 11/037* (2013.01); *C09D 11/101* (2013.01); *C09D 11/102* (2013.01); *C09D 11/104* (2013.01); *C09D 11/107* (2013.01); *C09D 11/38* (2013.01); *H05K 1/0393* (2013.01); *H05K 3/0011* (2013.01); *C09D 11/30* (2013.01); *H05K 2201/0133* (2013.01)

(58) Field of Classification Search
CPC ..... C09D 11/104; C09D 11/107; C09D 11/38; C09D 11/30; H05K 3/0011; H05K 2201/0133; H05K 1/0393; B41F 15/40; B41M 5/0023

See application file for complete search history.

(56) References Cited

U.S. PATENT DOCUMENTS

| | | | |
|---|---|---|---|
| 8,454,859 B2 * | 6/2013 | Lowenthal | H01B 1/22 252/514 |
| 10,577,515 B1 | 3/2020 | Chopra et al. | |
| 2005/0176246 A1 | 8/2005 | Yang | |
| 2013/0313968 A1 | 11/2013 | Wagner et al. | |
| 2014/0035995 A1 | 2/2014 | Chou et al. | |
| 2014/0151607 A1 | 6/2014 | Lowenthal et al. | |
| 2015/0064417 A1 | 3/2015 | Choi et al. | |
| 2016/0319139 A1 | 11/2016 | Surendran et al. | |
| 2017/0298242 A1 | 10/2017 | Mostowy-Gallagher et al. | |
| 2020/0283649 A1 | 9/2020 | Liu et al. | |

FOREIGN PATENT DOCUMENTS

| | | |
|---|---|---|
| JP | H05179185 A | 7/1993 |
| JP | 200038534 A | 2/2000 |
| JP | 2003055053 A | 2/2003 |
| JP | 2003292857 A | 10/2003 |
| JP | 2010247408 A | 11/2010 |
| JP | 2016139153 A | 8/2016 |
| WO | 2005066977 A1 | 7/2005 |
| WO | WO2012045736 A1 | 4/2012 |
| WO | WO2012078820 A1 | 6/2012 |
| WO | WO2015087350 A1 | 6/2015 |
| WO | WO2016060838 A1 | 4/2016 |

\* cited by examiner

DIELECTRIC INK COMPOSITION

CROSS-REFERENCE TO RELATED APPLICATIONS

This application is a continuation of U.S. Nonprovisional Application No. U.S. Ser. No. 16/613,344, filed Nov. 13, 2019, which is the U.S. national stage application of International PCT Application No. PCT/US2018/032503, filed May 14, 2018, which claims the benefit of U.S. Provisional Application No. 62/506,095, filed in May 15, 2017, the subject matter of each which is herein incorporated by reference in its entirety.

FIELD OF THE INVENTION

The invention relates to screen-printable and dispensable dielectric ink compositions for stretchable electronic surfaces.

BACKGROUND OF THE INVENTION

A dielectric material (otherwise known as a "dielectric") is an electrical insulator that is capable of being polarized by an applied electric field. Examples include, but are not limited to, porcelain (ceramic), mica, glass, plastics, and the oxides of various metals. Dry air is also an excellent dielectric and is used in variable capacitors and some types of transmission lines. Distilled water is a fair dielectric. A vacuum is an exceptionally efficient dielectric.

An important property of a dielectric is its ability to support an electrostatic field while dissipating minimal energy in the form of heat. The lower the dielectric loss (the proportion of energy lost as heat), the more effective is a dielectric material. Another consideration is the dielectric constant, the extent to which a substance concentrates the electrostatic lines of flux. Microwave circuits, and multilayer circuits in particular, which may be made from low-loss dielectric materials provided with a metallic coating, are known.

The process of thermoforming a decorated sheet to produce a three-dimensional decorated article is also well-known in the industry, and various inks have been formulated for this process. U.S. Pat. Nos. 6,956,098, 4,061,584, 8,767,378 and WO/2016/012753, the subject matter of each of which is herein incorporated by reference in its entirety, describe high elongation inks that can be formulated to have sufficient adhesion to a substrate, such as polycarbonate, polyesters, acrylics, and others, and flexibility so that they do not crack during the thermoforming process. An advantage of this process is to allow reverse-printing on a second surface of a transparent plastic substrate so that the visible surface in contact with the environment has resistance to scratch, abrasion, and weathering. Inks can further be printed on this surface and back filled with molten plastic to create encapsulated electronic devices. Applications for this process include automotive interior parts such as instrument panels, appliance control panels, moldings, and display moldings. Methods for producing decorated and functionalized thermoformed and in-molded electronic devices have also been described, such as the formation of in-molded capacitive switches and encapsulated displays, in U.S. Pat. Pub. No. 2008/0257706, U.S. Pat. No. 4,592,961, and U.S. Pat. Pub. No. 2003/0121767, the subject matter of each of which is herein incorporated by reference in its entirety.

Dielectric inks play crucial part in manufacturing complex electronic devices. The insulating (or dielectric layer) is a printable fluid formulated to be compatible with the graphic first down layer, as well as with the conductive second down layer. Because the second layer conductive ink may only partially cover the entire printed area of the first layer, the third printed layer must be compatible with graphic printed and dried layers, as well as the printed and dried conductive circuitry of subsequent printed layers, and the unprinted substrate. In many areas, the insulating layer will make direct contact with the graphic printed layers, and the unprinted substrate, as well as that of the conductive printed circuit.

Various UV and thermally curable dielectric inks have been reported. For example, U.S. Pat. No. 8,659,158, the subject matter of which is herein incorporated by reference in its entirety, describes aqueous compositions for forming micro-fluid jet printable dielectric film layers. However, the composition is not stretchable, and the presence of water makes the system incompatible with the conductive layer.

The fundamental process for stretchable interconnects involves blending highly dielectric materials with soft elastic materials such as rubber-like elastomers. This approach is attractive because it allows conventional, high-performance electronic components to be implemented on soft substrates. U.S. Pat. No. 4,425,263, the subject matter of which is herein incorporated by reference in its entirety, discloses such a process of making stiff inorganic devices integrated into soft and compliant polymer substrates. However, these inorganic devices undergo a significant change under stretching, leading to poor interconnect performance and reliability.

U.S. Pat. No. 3,746,662, the subject matter of which is herein incorporated by reference in its entirety, describes an ink that is made of a low molecular weight liquid epoxy resin and hardening agent. However, the hardening agent is flaky and hard, and it is not applicable to manufacturing flexible circuits. U.S. Pat. No. 4,592,961, discloses that in order to enhance the flexibility of the dielectric ink, polyvinyl dichloride polymer is added to an aromatic polyester resin. However, the dielectric ink is prone to forming a gel after being kept in storage for an extended time.

Similarly, CN105315788, U.S. Pat. No. 8,659,158, WO2016014504, WO2014085473, U.S. Pat. No. 9,441,126, and JP2016028165, the subject matter of each of which is herein incorporated by reference in its entirety, describe a variety of dielectric ink compositions. Typically, the dielectric ink or coating is formulated using a similar energy curable resin as that used in the graphic layer. However, in order to be highly insulating to meet the range of requirements of various devices, the dispersed phase is selected to be any of a number of insulating electronic devices.

The ability to create a complex thermoformed in-mould device comprising multiple layers of graphic inks, conductive circuitry, insulating layers, as well as various electronic elements such as displays, lighting, sensors, and the like, has been difficult to achieve in practice. Thus, there remains a need in the art for a system of decorative and functional inks and coatings that can be used together in a layered design to create a decorative and functional part.

A conductive layer printed over a decorative layer for example, can have increased resistance due to interference by the underlying decorative layer. In addition, many such inks are effectively incompatible with each other, with the various printed layers insufficiently adhering to each other, resulting in an unstable electrical or electronic device.

For example, an insulating (dielectric) ink which is printed over a conductive ink may leave gaps or subsequently shear or peel away, resulting in inadequate insulation in the resulting electrical, electronic or optoelectronic device. Known UV-curable inks are not appropriate for use in functional electronic devices constructed entirely using printing technology. The few that are designed for this type of application either do not have the optical clarity required for fully printed optoelectronics devices or can only be overcoated or overprinted with another UV curable ink, not a heat curable ink. Finally, it is not believed that any of the known inks have the ability to withstand severe forming.

As far as prior art heat-curable dielectric inks are concerned, it is not believed that there are any known inks that are heat-curable, creasable, and stretchable. Recently, printing techniques which use flexible and inexpensive polymer substrates such as polyethylene terephthalate (PET) have been developed. These techniques require curing temperature to be low (less than about 150° C.) due to the low glass transition temperature of the substrate.

There remains a need in the art for compositions that have low processing temperatures to allow deposition onto flexible substrates and subsequent heat treatment, while still providing features with adequate electrical and mechanical properties. Similarly, with continuous demand for high throughput, fast curing inks are preferred, and it would be advantageous to provide compositions that are capable of offering enhanced resolution control. UV curable compositions are generally not suitable for heat treatment. Thus, in some applications, where the substrate is precoated and/or undercured, thermally curable dielectric inks are preferred. During forming process, the assembly gets final curing. In addition, as a process simplicity, many customers desire to use air circulating ovens for the entire operation.

In some instances, a thermoformed system of a layered dielectric over a printed conductive circuit undergoes severe cracking due to the incompatibility of the dielectric layer with the printed electronic circuit or due to the inability of the printed circuit to deform without cracking during the thermoforming process.

Another difficulty is maintaining resistance in a printed circuit which contains a binder system that also allows for deformation without cracking. In many instances, the binder system acts as an insulator for the conductive dispersed phase to such a degree that although the circuit can be formed without cracking, it does not have sufficient conductivity to function reliably in a printed and thermoformed device.

Thus, it would be desirable to develop a printable fluid that exhibits flexibility during thermoforming, which can maintain conductivity/resistivity after thermoforming, is compatible with adjacent printed layers, and has excellent intercoat adhesion. Accordingly, there also remains a need for a common ink binder or binding medium which may be utilized in both conductive ink and a dielectric ink, and that is capable of providing a conductive ink and dielectric ink system. In addition, there remains a need for a UV curable/thermally curable dielectric ink which can be stretched and used effectively in in-mold applications or stretchable electronics where line continuity and bending properties are important. The dielectric ink should also be capable of producing a resulting insulating layer or article of manufacture which exhibits significant optical transparency and comparatively low surface roughness.

Known dielectric inks are also generally not suitable for selective structuring and stretching in the UV range, as required, for example, in in-mould applications and for printed dielectrics in microelectronics. Also, known dielectric inks do not exhibit the required continuity to environmental characteristics which are required for specific applications such as forming.

In conventional dielectric ink compositions, common resins, such as epoxy resins, are flaky and hard, which is of limited use in making stretchable interconnects. These compositions are also prone to gel formation after being kept in storage for an extended time as described, for example, in U.S. Pat. No. 3,746,662. Other polymeric inks have the disadvantage of non-flexibility. As a result, the functional circuit made of the dielectric ink is prone to cracking.

UV-curable acrylate-based formulations have also been widely used in the electronic industry. Typically, UV-curable acrylate-based formulations are used in coating applications and are applied by various coating techniques. Polyamides are commonly used as dielectric materials in the electronic industry and are typically applied either by film lamination or spin-coating liquid polyamides.

With increasing demands for smaller, flexible and stretchable higher efficiency electric devices, UV and thermal curing techniques have become appealing. It is a technical challenge to simultaneously achieve the requirements of electric performance, such as high resistance, thermal stability, good adhesion to conductive layer, processing performance and desired level of bending and forming characteristics.

Therefore, there remains a need in the art for compositions that have low processing temperatures, to allow for deposition onto flexible substrates and subsequent heat/UV treatment, while providing adequate dielectric and mechanical properties. It would also be advantageous if the compositions offered enhanced resolution control.

Micro-electronic circuits are typically made using expensive deposition, plating and etching technologies. Such technologies typically require significant investments, and clean room atmospheres. It is often time consuming and expensive to make slight variations in components, accordingly, manufacturing lines are often set up for a single application.

Additionally, many electronic devices may require multi-level wiring or conductors as well as multi-level active and passive devices. In such multi-level constructions, dielectric layers may be used between the overlapping layers of active and passive devices. Accurate placement and formation of the dielectric layers using conventional techniques is often time consuming and requires specialized equipment. As circuits become more complicated and require more levels of devices, there continues to be a need for improved and cost-effective manufacturing techniques.

SUMMARY OF THE INVENTION

It is an object of the present invention to provide a composite dielectric powder or flake that is capable of producing a dielectric ink composition which is high in resistivity, exhibits minimal change in resistivity after a thermal shock test, is capable of passing a humidity and DC applied test, and is capable of improving thermal and reliability properties of devices.

It is another object of the present invention to provide a dielectric ink composition for forming electric circuits which are highly flexible and that can be printed on a substrate that undergoes stretching or bending with 10% strain without sacrificing physical properties of the dielectric material.

It is still another object of the present invention to provide a dielectric ink composition for forming electronic circuits that is high in resistivity, capable of improving the probability of contact between the dielectric material, increasing insulating properties of the electric circuits, and that exhibits excellent migration resistance.

It is still another object of the present invention is to provide compatible silver/carbon overprint compositions which are high in resistivity and have excellent creasing properties.

It is still another object of the present invention to provide an electronic circuit suitable for forming fine circuits.

It is yet another object of the present invention to provide a method of fabricating stretchable electronic circuits having high dielectric properties which change minimally after thermal shock and wet load testing.

It is still another object of the present invention to produce micro-structures of layers denser than those of conventional inks and have much lower electric resistance even with relatively low thickness or fine line width, as compared with the dielectric pattern formed from a conventional paste.

It is still another object of the present invention to provide a method of producing an electronic circuit suited for forming fine circuits.

It is still another object of the present invention to provide a dielectric ink composition that allows for heat treatment at very low temperatures without the use of expensive nano-sized metal particles.

Accordingly, these and other objects of the invention are achieved by the invention described herein.

In one embodiment, the present invention describes a flexible dielectric ink composition comprising:
 a) a dielectric material wherein the dielectric material is in the form of a powder, flakes, or resin; and
 b) one or more or more organic binders; and
 c) one or more UV-curable initiators, thermally curable initiators, crosslinking agents and/or drying agents.

The present invention relates to generally flexible and stretchable UV (ultraviolet) and thermally curable dielectric ink compositions and that can also be thermo or vacuum formed. The flexible ink can form a stretchable dielectric coating having an excellent adhesion. The dielectric ink can be applied on a circuit board, such as a paper-phenolic resin board, plastic board (PMMA, PET or the like) or a glass-epoxy resin board, by screen printing or the like, followed by heat or UV (ultraviolet) curing. The dielectric ink is suitable for use in applications such as a capacitive touch or in mould forming dielectric inks a cross over insulation layers, and in manufacturing electric circuitry and devices.

The present invention relates to generally UV and thermal curable ink compositions for use in silver underprint/overprint, cross over junction insulation layer formation and thermoforming, without any break in continuity. The compositions of the invention are stretchable, creasable and room temperature stable. The compositions described herein are heat-curable, or UV curable and are a one-part system.

The present invention also relates generally to dielectric materials, more particularly to dielectric flexible pastes or inks for flexible and stretchable substrates or films.

The present invention also relates generally to methods of fabricating electronic dielectric ink printed thermoformed devices.

In one embodiment, the present invention related generally to a screen-printable dielectric ink composition which is useful for making silver/carbon trace, cross over junction insulation and stretchable electronics, which comprises 10~80% by weight dielectric material dispersed in 70-20% by weight organic medium. wherein the organic medium is a solution of mono or multivinyl monomers/oligomers and/or solvent, and wherein the weight ratio of resin to solvent being 0.5 to 1.5.

In one embodiment, the present invention relates generally to a method of making a capacitive touch device comprising the steps of applying onto a flexible substrate, by over printing, a composition as described above and drying/curing the printed composition to remove the solvent therefrom. The present invention also related generally to a capacitive touch device and stretchable electronics formed as a product of the method.

The dielectric ink compositions described herein provide better compressive strength (CS), diametral tensile strength (DTS), and flexural strength (FS) as compared with existing pastes/inks.

The present invention also relates generally to a flexible ink for forming a dielectric layer. The dielectric layers are formed as dielectric patterns on stretchable electronic surfaces. These layers can also be overprinted on already printed conductive layers. The composition is stretchable up to about 130%, preferably up to about 140%, more preferably up to about 150% and thermoformable/cold drawable. Additionally, the composition is creasable.

BRIEF DESCRIPTION OF THE DRAWINGS

For a fuller understanding of the invention, reference is made to the following description taken in connection with the accompanying figures, in which.

DETAILED DESCRIPTION OF THE PREFERRED EMBODIMENTS

Figure 1:
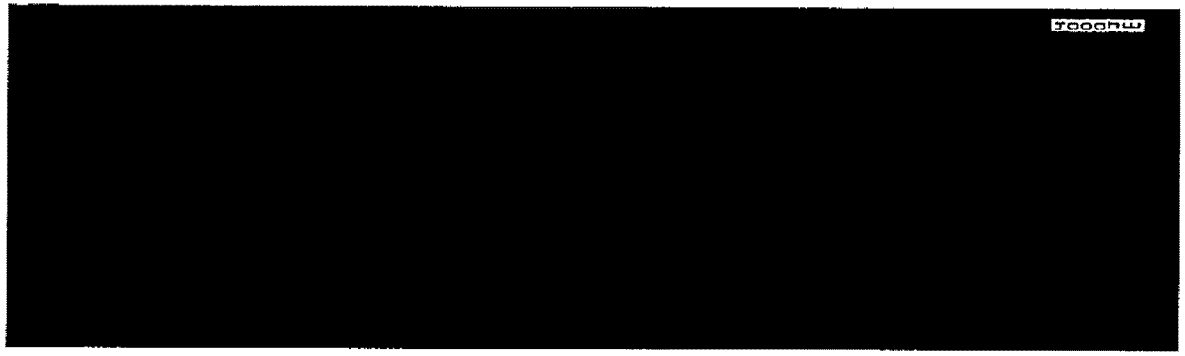
FIG. 1 depicts a print window optimization using the ink described in Example 8.

The present invention relates generally to flexible, screen-printable or jet-printable dielectric ink compositions. As described herein, the present invention relates generally to dielectric compositions useful for stretchable electronic surfaces, in-mould applications, and silver trace and cross over junction insulation. Applications of stretchable electronics include, but are not limited to, printed electronics, radio frequency identification devices (RFID), biomedical, in-mould electronics, organic light emitting diode (OLED) lighting, light emitting diode (LED) lighting, heaters, touch panels, wearables, electroluminescent, smart packing, and photovoltaics.

As used herein, "a, "an," and "the" refer to both singular and plural referents unless the context clearly dictates otherwise.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform in the invention described herein. Furthermore, it is also to be understood that the value to which the modifier "about" refers is itself specifically disclosed herein.

As used herein, spatially relative terms, such as "beneath", "below", "lower", "above", "upper", "front", "back", and the like, are used for ease of description to describe one element or feature's relationship to another element(s) or feature(s). It is further understood that the terms "front" and "back" are not intended to be limiting and are intended to be interchangeable where appropriate.

As used herein, the terms "comprises" and/or "comprising," specify the presence of stated features, integers, steps, operations, elements, and/or components, but do not preclude the presence or addition of one or more other features, integers, steps, operations, elements, components, and/or groups thereof.

In order to provide a dielectric layer on a substrate using a micro-fluid jet printing device, fluids for providing the dielectric layer must meet certain criteria. Likewise, the resulting dielectric layers have requirements that are important to providing suitable dielectric layers on a substrate. Such requirements include, but are not limited to, electrical requirements, e.g., dielectric constant, resistivity, breakdown voltage, dissipation factor; fluid requirements, e.g., jetting reliability, stability, cartridge material compatibility, and the like; film integrity requirements; process/environmental requirements, e.g., compatibility with subsequent processing environment; and mechanical/physical/chemical requirements. The present invention fulfills all these and additional requirement of stretchability and formability.

In one embodiment, the present invention relates generally to a flexible dielectric ink comprising:
a) a dielectric material wherein the dielectric material is in the form of a powder, flakes, or resin;
b) one or more or more organic binders; and
c) one or more UV-curable initiators, thermally curable initiators, crosslinking agents and/or drying agents.

More particularly, the present invention is concerned with a flexible dielectric ink composition that can form a stretchable dielectric coating having an excellent adhesion through application of the dielectric ink on a circuit board, such as a paper-phenolic resin board, plastic board (poly(methyl methacrylate (PMMA), polyethylene terephthalate (PET), or the like) or a glass-epoxy resin board, by screen printing or the like, followed by heat or UV curing. The inventive ink is suitable for use in applications such as a capacitive touch, as a conductor for wiring of a circuit board, and as a dielectric coating produced by applying the ink by coating or printing and curing the ink.

Suitable dielectric compounds for use in the dielectric ink compositions of the invention may be selected from the group consisting of titanium dioxide, silica, fumed silica, polymer resins, polyamide waxes, micronized polyamide waxes, strontium titanate, talc (talc comprising $MgO \cdot 4SiO_4 \cdot H_2O$), clays, and combinations of one or more of the foregoing. Other compounds include, but are not limited to, Teflon® (e.g., RT/Duroid® 6002, a product available from Rogers Corp. Chandler, Ariz.), a polyparaxylene (Parylene N), monochloropolyparaxylene (Parylene C), dichloropolyparaxylene (Parylene D) (all available from Specialty Coating Systems Inc., Indianapolis, IN), and perfluoro-p-xylylene (a product of Union Carbide Corp.) which have a higher thermostability as compared to Teflon. Suitable clays include, but are not limited to, kaolinite, bentonite, bentone, illite, muscovite, chlorite, montmorillonite and the like, and may also include polymeric complexes of clays.

In a preferred embodiment, the dielectric compound comprises fumed silica, in the range of about 0.01% to about 40%, or from about 0.02% to about 25%, preferably in the range of about 0.5% to about 30%. The silica includes treated silica such as hydrophobic or hydrophilic silica; and clay, such as a kaolinite clay, bentonite, bentone, illite or muscovite, or chlorite, or a montmorillonite type clay, such as for one example a talc, in the range of about 0.1% to about 20%, or from about 1% to about 68%, preferably in the range of about 5% to about 15%. An organoclay may also be used in the range of about 0.1% to about 52%, or from about 0.2% to about 30%, but preferably in the range of about 5% to about 35%.

The organic binder may be selected from the group consisting of (a) branched polyol esters, (b) saturated or unsaturated polyesters, (c) amino resins (d) copolyesters derived from glycols and dibasic acids, (e) polyurethanes and polyurethane telechelics, (f) alkyd resins, and combinations of one or more of the foregoing.

For a flexible and stretchable substrate made of an insulating resin, on which a dielectric pattern is to be formed, an organic resin material having a thermosetting or thermoplasting curing/drying temperature as low as possible is employed as a binder. Examples include, but are not limited to, acrylic resins, urethane resins, polyester resins, alkyd resins, vinyl acetate resins, styrene resins and a vinyl chloride-vinyl acetate copolymers; a modified resin obtained by partially modifying any one of the above-exemplified resins with an epoxy group, a phenol group or the like; and polycarbonate resins, epoxy resins, phenol resins, melamine resins, polyimide resins, melamine alkyd resins, and modified resins thereof. These resins can be used either singly or in combination. In addition, silicone resins can also be used. The amount of the binder used is generally 5 to 85 wt. % of the ink, preferably 5 to 55 wt. %. The dielectric properties may become inferior above this range of binder and the binding power becomes lower below this range.

In some embodiments, the resin may be a curable monomer, oligomer, or polymer organic resin. The monomer and/or oligomer may be unsaturated polyester, amino resin (e.g. melamine resin), epoxy monomer and/or oligomer. Exemplary epoxy monomers and/or oligomers include, but not limited to liquid epoxy, liquid epoxy combination, and solid epoxy in solution. For example, the epoxy monomer and/or oligomer may be selected from substituted (e.g., amine or hydroxyl substituted) or unsubstituted epoxy, such as, 1,2-epoxypropane, 1,3-epoxypropane, butylene oxide, n-hexyl propylene epoxide or the like. Examples of commercially available epoxy monomers and oligomers include Araldite DY 027 (available from Chemica Inc., Los Angeles, CAN, Cardula N-10 (available from Vantlco Inc., Brewster, NY), Epiclon EXA-830CRP (available from DIC Corporation, Japan), and combinations of one or more of the foregoing.

Preferred binders include linear or branched polyesters and unsaturated polyesters. For adding the desired flexibility and stretchability, branched polyester or polyol polyesters are also used. Conventional polyesters tend to crystallize, therefore copolyesters and combination with amorphous linear polyester are preferred. Typically, the polyester resins which are usable in the invention are polycondensation products of an aromatic dicarboxylic acid such as isophthalic or terephthalic acid with a C .substituted 2-4 dihydroxy alkane such as ethylene or propylene glycol. Poly (ethylene isophthalate) is preferred. In order to make flexible and stretchable printed film, non-crystalline copolyesters such as ester of adipic acid and neopentyl glycol, adipic acid neopentyl glycol and 1,6-hexane diol may be used. Many commercial products such as Dynapol series esters, DIC's polyols polyester series copolyesters, Primaalloy from Mitsubishi, Vylon from Toyobo chemicals, Setal 173 VS60 and Setal 168 SS80 from Nuplex, Nippon hosei series polyester and the like may also be used. Typically, the polyester resin used in the organic medium of the instant invention exhibits the following properties: specific gravity, in the range from about 1.0 to about 1.35; viscosity in in the range from about 800 to about 50000 cPs, elastomeric nature with excellent film forming characteristics, color, Gardner b, in the range from about 15 to about 30; softening point (R and B) to be less than 100° C., and solubility, up to 20% solids dissolvable in esters or high boiling points ether esters. moisture, %, 0.3 max; particle size, approximately ⅛" cubes, 100% through ¼" screen; 1 to about 35%, by weight of polyester resin dissolved in nonhydrocarbon polar solvent. Preferably the resin is approximately 5 to 25%% by weight of the medium.

For better stretchability, crack resistivity and bending, additional elastomers and/or oligomers may be incorporated. The principal elastomer of the composition is an acrylic polymer having carboxyl, hydroxyl, or amide groups, or a mixture of these, and preferably having a weight average molecular weight of 25,000-5,00,000 and a glass transition temperature of −20° ° C. to +125° C. Typically useful acrylic polymers contain alkyl methacrylate, alkyl acrylate, hydroxyalkyl acrylate, hydroxyalkyl methacrylate and can contain styrene, acrylic acid or methacrylic acid. Amide monomers such as methacrylamide and acrylamide can be used; glycidyl monomers such as glycidyl acrylate or glycidyl methacrylate can also be used. Isoprene based liquid rubber and like may also be used.

For further achieving pliability of the inventive composition, isoprene-based rubbers, polybutene, polyisobutylene, liquid silicones (e.g. GI1000 from Silicones Inc.), blocked polyisocyanates and long chain acrylic oligomers and polymers are used. Preferred acrylic polymers are of an alkyl methacrylate that has 1-18 carbon atoms in the alkyl group, an alkyl acrylate that has 1-18 carbon atoms in the alkyl group and a hydroxyalkyl acrylate or a hydroxyalkyl methacrylate each having 2-4 carbon atoms in the hydroxyalkyl group. To form an acrylic polymer which has a hydroxyl content of 2-6% by weight, a sufficient amount of the aforementioned hydroxyalkyl acrylate or methacrylate is utilized. The polymer also can contain small amounts of ethylenically unsaturated carboxylic acid, such as acrylic acid, methacrylic acid, itaconic acid, in amounts of 0.1-5% by weight. Typical alkyl methacrylates and acrylates that can be used to prepare the acrylic polymers are: methyl methacrylate, ethyl methacrylate, butyl methacrylate, hexyl methacrylate, 2-ethylhexyl methacrylate, nonyl methacrylate, lauryl methacrylate, stearyl methacrylate, cyclohexyl methacrylate, isodecyl methacrylate, propyl methacrylate, phenyl methacrylate, isobornyl methacrylate, methyl acrylate, ethyl acrylate, propyl acrylate, isopropyl acrylate, butyl acrylate, isobutyl acrylate, hexyl acrylate, 2-ethylhexyl acrylate, nonyl acrylate, lauryl acrylate, stearyl acrylate, cyclohexyl acrylate, isodecyl acrylate, phenyl acrylate, isobornyl acrylate, and the like.

The desired stretchability in this invention can be achieved by various polyesters, polyester polyol or acrylates and amino resin and blocked polyisocyanate resins as further described herein.

Two types of stretchable dielectric ink compositions are introduced by this invention, thermally curable ink compositions and UV curable ink compositions.

For the thermally curable ink compositions, the compositions may be crosslinked or dried (non-crosslinking). The crosslinking compounds may be added sequentially or at the same time. Crosslinking may be accomplished with conventional dispersible polyisocyanate crosslinkers. Optimal cross-linking performance requires a relatively high level of terminal primary or secondary amine groups in the polyurethane/acrylate/reactive compositions of the invention and generally, the more amine used, the more likely it is that the pot-life of the composition will be reduced after addition of the cross-linker. Therefore, preferred cross-linkers are those reactive at high temperature, such as polyfunctional aziridine compounds, isocyanates, zinc ammonium carbonate, zirconium carbonate, polyfunctional carbodiimide compounds and/or oxirane (preferably epoxy) compounds.

Alternatively, cross-linkers can be used in combination with each other. Successful formulations can also be produced using dibutylene tin dilaureate type catalysts. Another effective composition comprises the isocyanate Bayhydur 3100 with a melamine formaldehyde (such as that available commercially from Nuplex).

Depending on the desired properties, the total amount of all cross-linkers is preferably present in an amount by dry weight of the total formulation is from about 1% to about 30%; more preferably from about 2% to about 25%, most preferably from about 2% to about 20%. Preferably any one cross-linker is present in an amount by dry weight of the total formulation of from about 1% to about 25%; more preferably from about 3% to about 20%; most preferably from about 4% to about 15%; for example, about 5%.

Optimization of formulations is required as an incorrect amount may have a detrimental effect. For example, if an excessive amount of cross-linker is added the subsequent residual unreacted material may act like a plasticizer leading to a reduction in the resistance properties of the coating—as well as affecting the overall printability of the material.

There are available a range of urethane acrylic copolymer dispersions that already possess an internal cross-linking mechanism. Examples are Ucecoat DW 5681 and Ucecoat DW 5150 available from UCB Additional examples of such cross-linkers include melamine formaldehyde, polyfunctional aziridine compounds, isocyanates, zinc ammonium carbonate, zirconium carbonate, polyfunctional carbodiimide compounds, and/or oxirane (preferably epoxy) compounds: oxirane, isocyanate, arizidine or carbodiimide. These curing agents also help provide pliability to the composition after curing. It is also surprisingly found that optimized formulations yield very good adhesion on various plastic and metallic surfaces.

The curing agent or reactive ingredient may be a monomer and/or oligomer from cyanate ester monomer and/or oligomer. The cyanate ester may comprise various suitable cyanate esters known in the art, including isocyanates. Suitable cyanates include, for example, ethylene diisocyanate; 1,4-tetramethylene diisocyanate; 1,4 and/or 1,6-hexamethylene diisocyanate; 1,12-dodecane di isocyanate; cyclobutane-1,3-diisocyanate; cyclohexane-1,3- and 1,4-diisocyanate and mixtures of these isomers; 1-isocyanato-3,3,5-trimethyl-5-isocyanatomethyl cyclohexane; 2,4- and 2,6-hexahydrotolylene diisocyanate and mixtures of these isomers; hexahydro-1,3- and/or 1,4-phenylene diisocyanate; perhydro-2,4'- and/or 4,4'-diphenyl methane diisocyanate; 1,3- and 1,4-phenylene diisocyanate; 2,4- and 2,6-toluene diisocyanate and mixtures of these isomers; diphenyl methane-2,4'- and/or 4,4'-diisocyanate; naphthylene-1,5-diisocyanate; 1,3- and 1,4-xylylene diisocyanate, 4,4'-methylene-bis(cyclohexyl isocyanate), 4,4'-isopropyl-bis(cyclohexyl isocyanate), 1,4-cyclohexyl diisocyanate and 3-isocyanatomethyl-3,5,5-trimethylcyclohexyl isocyanate (IPDI); 2,4- and 2,6-toluene diisocyanate; diphenylmethane diisocyanate; hexamethylene diisocyanate; dicyclohexylmethane diisocyanate; isophorone diisocyanate; 1-methyoxy-2,4-phenylene diisocyanate; 1-chlorophenyl-2,4-di isocyanate; p-(1-isocyanatoethyl)-phenyl isocyanate; m-(3-isocyanatobutyl)-phenyl isocyanate and 4-(2-isocyanate-cyclohexylmethyl)-phenyl isocyanate, isophorone diisocyanate, toluene diisocyanate and mixtures thereof.

In some compositions, separate crosslinkers may not be added and only a drying mechanism is preferred. These compositions use non-crosslinkable resins.

For the UV-curable dielectric ink compositions, photoinitiators are used. Examples of photoinitiators that are usable in the present invention include radical initiator photoinitiators such as benzoin and its alkyl ethers, benzophenone and its derivatives, xanthone, thioxanthones, chlorinated thioxanthones, and acetophenone derivatives, and halogenated, aliphatic and aromatic polychlorinated biphenyls and polyphenyls are preferred.

Additional examples of suitable photoinitiators include, but are not limited to, Irgacure 184 (1-hydroxycyclohexyl phenyl ketone), Irgacure 907 (2-methyl-1-[4-(methylthio)phenyl]-2-morpholino propan-1-one), Irgacure 369 (2-benzyl-2-N,N-dimethylamino-1-(4-morpholinophenyl)-1-butanone), Irgacure 500 (the combination of 50% by weight 1-hydroxy cyclohexyl phenyl ketone and 50% by weight benzophenone), Irgacure 651 (2,2-dimethoxy-2-phenyl acetophenone), Irgacure 1700 (the combination of 25% by weight bis(2,6-dimefhoxybenzoyl-2,4-,4-trimethyl pentyl) phosphine oxide, and 75% by weight 2-hydroxy-2-methyl-1-phenyl-propan-1-one), Irgacure 2020 (a blend of BAPO (Irgacure 819) plus an alpha hydroxy ketone), Darocur 1173 (2-hydroxy-2-methyl-1phenyl-1-propane) and Darocur 4265 (the combination of 50% by weight 2,4,6-trimethyl-benzoyldiphenyl-phosphine oxide, and 50% by weight 2-hydroxy 2-methyl-1-phenyl-propan-1-one) (all available commercially from Ciba-Geigy Corp., Tarrytown, NY); CYRACURE UVI-6974 (mixed triaryl sulfonium hexafluoroantimonate salts) and CYRACURE UVI-6990 (mixed triaryl sulfonium hexafluorophosphate salts) (available commercially from Union Carbide Chemicals and Plastics Co. Inc., Danbury, CT); and Genocure CQ, Genocure BOK, and Genocure M.F. (all available commercially from Rahn Radiation Curing). Combinations of one or more of these materials may also be employed herein.

An example of a particularly preferred photoinitiator is a mixture of Irgacure 500 and Irgacure 2020. Darocur® 1173, Irgacure 184 and Irgacure® 369 are also preferred.

The photoinitiator(s) are preferably added to the prepolymer in quantities of approximately 0.1 to approximately 5 wt.-%, based on the total weight of the prepolymer. Darocur® 1173 and Irgacure® 369 are made up of 2-hydroxy-2-methyl-1-phenyl-1-propanone and 2-benzyl-2-N,N-dimethylamino-1-(4-morpholinophenyl)-1-butanone, respectively. Because the prepolymer is photopolymerizable and is therefore selectively structurable, it may be used advantageously in the production of the presently customary microelectronic multilayer circuits. The prepolymer is necessary to produce holes in the dielectric material for through contacts, or it may be used in circuits having a dielectric material only in certain areas. To increase the storage life, the prepolymer may contain a stabilizing agent, such as a phenolic inhibitor, to prevent premature polymerization.

Other photosensitizers include 1- and 2-chloroanthraquinone, 2-methylanthraquinone, 2-tertiary butyl anthraquinone, octamethylanthraquinone, 1-4-naphthoquinone, 9-10-phenanthrenequinone, 1,2-benzanthraquinone, 2-3-benzanthraquinone, 2-methyl-1,4-naphthoquinone, 2-3-dichloronaphthoquinone, 1-4-dimethylanthraquinone, 2-3-dimethylanthraquinone, 2-phenylanthraquinone, 2-3-diphenylanthraquinone, sodium salts of anthraquinone alphasulfonic acid, 3-chloro-2-methylanthraquinone and the like. Other photoinitiators which are also useful are described in U.S. Pat. No. 2,760,863, the subject matter of which is herein incorporated by reference in its entirety, and include vicinal ketadonyl compounds, such as diacetyl benzyl, etc., alpha ketadonyl alcohols, such as benzoin, pivaloin, etc., acyloin ethers, e.g., benzoin methyl and ethyl ethers, etc., alpha hydrocarbon substituted aromatic acyloins, including alphamethyl benzoin, alpha-allyl benzoin, and alpha phenyl benzoin. Also included are the diacylhalomethanes, included are 2-bromo-1,3-diphenyl-1,3-propane dione; 2,2-dibromo-1,3-indane dione; 2,2-dibromo-1,3-diphenyl-1,3-propane dione; 2-bromo-2-(phenylsulfonyl acetal phenone) and the like, as further described in U.S. Pat. No. 3,615,455.

The photoinitiator is preferably present at about 0.1 to 15 wt. % of the dielectric composition, more preferably present in an amount of about 1 to 10 wt. % of the dielectric composition; and most preferably in an amount of about 3 wt. % of the total weight of the dielectric composition.

In one embodiment, a photoinitiator for a first wavelength and a photoinitiator for a second wavelength may be included in the dielectric ink composition. For example, the dielectric ink composition may comprise about 0.01 to 10% by weight a first photoinitiator for a first range of wavelength and about 0.05 to 10% by weight of a second photoinitiator for a second range of wavelength. In this embodiment, the first wavelength may be between about 300 nm and about 350 nm and the second wavelength may be between about 360 nm and about 400 nm.

In one preferred embodiment, the dielectric ink compositions described herein, especially heat curable compositions, may include solvents. This ink can be employed for various printing methods such as gravure, flexo, screen, rotary, dispenser, and offset printing, after modulating the viscosity and adding an appropriate binder. The viscosity for coating is in the range of 1 to 70,000 cPs. In the case of silkscreen, the viscosity is in the range of 10,000 to 35000 cPs, preferably 5,000 to 40,000 cPs.

In one preferred embodiment, the dielectric ink composition may further comprise one or more of a high and/or a low boiling solvent, and/or one or more plasticizers, to aid better paste formulation and provide greater flexibility of the final composition. What is meant by "high boiling point solvent" is a solvent having a boiling point between about 110 and about 275° C. What is meant by a "low boiling point solvent is a solvent having a boiling point below about 100° C.

If used, the solvent may be a nonhydrocarbon polar solvent which must be capable of completely dissolving the binder resin component. In addition, the solvent must be sufficiently volatile that it can be vaporized from the composition below the thermal degradation temperature of the flexible substrate. Suitable materials include, but are not limited to, esters, alcohols and ethers as well as halogenated aromatics. While halogenated aromatics such dichlorobenzene are also suitable in the invention, they are not preferred because of the health hazards which may be associated with them.

Preferred solvents include aromatic solvents such as toluene, isopar series solvents and xylene, ketones such as cyclohexanone, methyl ethyl ketone, methyl isobutyl ketone and acetaldehyde, esters such as butyl acetate, ethyl acetate, carbitol acetate, propylene glycol methyl ethyl acetate, 2-ethoxy ethyl acetate and esters of a dibasic acid, cellosolves such as butyl cellosolve and ethyl cellosolve, alcohols such as α-terpinenol, isopropanol and butanol, phenols such as phenol and chlorophenol, butyl carbitol and acetates such as butyl carbitol acetate. Examples of ether include ethylene glycol phenyl ether, dowanol series solvents, 1,3-dioxolane, glycol ether acetates, and carbitol acetate. These solvents can be used either singly or in combination.

Mixtures of solvents are frequently used in order to adjust the volatility of the solvent component of the organic medium. In general, the boiling point of the solvent component(s) should be no less than about 150-250ºC. Solvents having a boiling point below about 150° C. tend to thicken the composition excessively during screening as solvent is evaporated therefrom. This can result in plugging of the screens which are used for printing patterns of the material onto the substrate. Within this limitation, however, the volatility of the solvent will be selected in consideration of the method of solvent removal and/or fabrication. For example, when the high-speed reel-to-reel procedure is used it is essential that the solvent be removed quite rapidly during processing. Thus, lower boiling solvent must be used such as those boiling from 150°-175° C. On the other hand, when slower fabrication procedures are used, less volatile solvents may be used such as those boiling from 175-220° C. In either case the solvent removal is ordinarily accelerated by mildly heating the printed substrate. Typically, the substrate is heated in a hot air oven to 70° C. to 90° when using more volatile solvents in the reel-to-reel process and 90°-120° C. when using less volatile solvents in the semi-automatic processes. Solvents are typically present in the composition in an amount of about 5 to 60 wt. %, more preferably about 10 to 40 wt. %.

Suitable plasticizers include, adipate-based plasticizers, trimellitates, maleates, sebacates, benzoates, epoxidized vegetable oils, sulfonamides, organophosphates, glycols, polyethers and various ethylene oxide-propylene oxide (EO/PO) copolymers.

Examples of preferred plasticizers include, but are not limited to, tetrahydrofurfurylalcohol, bis(2-ethylhexyl) phthalate (DEHP), diisononyl phthalate (DINP), bis(n-butyl)phthalate (DnBP, DBP), butyl benzyl phthalate (BBzP), diisodecyl phthalate (DIDP), di-n-octyl phthalate (DOP or DnOP), diethyl phthalate (DEP), diisobutyl phthalate (DIBP), di-n-hexyl phthalate, dimethyl adipate (DMAD), monomethyl adipate (MMAD), dioctyl adipate (DOA), trimethyl trimellitate (TMTM), tri-(2-ethylhexyl) trimellitate (TEHTM-MG), tri-(n-octyl,n-decyl) trimellitate (ATM), tri-(heptyl,nonyl) trimellitate (LTM), n-octyl trimellitate (OTM), dibutyl maleate (DBM), diisobutyl maleate (DIBM), dibutyl sebacate (DBS), N-ethyl toluene sulfonamide (ortho and 5 para isomers), N-(2-hydroxypropyl) benzene sulfonamide (HP BSA), N-(n-butyl) benzene sulfonamide (BBSA-NBBS), tricresyl phosphate (TCP), tributyl phosphate (TBP), triethylene glycol dihexanoate (3G6, 3GH), tetraethylene glycol diheptanoate (4G7), nitrobenzene, carbon disulfide and α-naphthyl salicylate, triethyl citrate (TEC), acetyl triethyl citrate (ATEC), tributyl citrate (TBC) acetyl tributyl citrate (ATBC), trioctyl citrate (TOC), acetyl trioctyl citrate (ATOC), trihexyl citrate (THC), acetyl trihexyl citrate (ATHC), butyryl trihexyl citrate (BTHC, trihexyl o-butyryl citrate), trimethyl citrate (TMC), nitroglycerine (NG), butanetriol trinitrate (BTTN), metriol trinitrate (METN), diethylene glycol dinitrate (DEGN), bis(2,2-dinitropropyl)formal (BDNPF), bis(2,2-dinitropropyl)acetal (BDNPA), 2,2,2-Trinitroethyl 2-nitroxyethyl ether (TNEN), sulfonated d naphthalene formaldehyde based 15 materials, sulfonated melamine formaldehyde based materials, and polycarboxylic ethers, dioctyl terephthalate 2,5-dimethyl-2,5 hexanediol (DOTP). Additional suitable plasticizers would also be known to those skilled in the art. In a preferred embodiment, the concentration of the plasticizer does not exceed 3 wt. % in the formulation.

The dielectric inks of the present invention can be applied not only on glass substrates but also on plastic substrates such as polyamide, particularly on a PET (polyethylene terephthalate) or PMMA (poly(methyl methacrylate), polyamide or PC (polycarbonate) substrate used as a substrate for flexible PCB.

It has been found that the inventive dielectric ink composition is effective in forming a screen printable ink. The inks are highly stretchable and compatible on compliant polymer substrate that remains continuous even under large and repeated stretching. The inks are also suitable for 3-D printing. This invention allows for the fabrication of flexible interconnects for stretchable electronic surfaces, which was not previously possible.

The dielectric ink or coating composition described herein may also contain colorants. Suitable colorants include, but are not limited to, organic or inorganic pigments and dyes. The dyes include but are not limited to azo dyes; anthraquinone dyes; xanthene dyes; azine dyes; combinations thereof, and the like. Organic pigments may be one pigment or a combination of pigments, such as for instance Pigment Yellow Numbers 12, 13, 14, 17, 74, 83, 114, 126, 127, 174, 188; Pigment Red Numbers 2, 22, 23, 48:1, 48:2, 52, 52:1, 53, 57:1, 112, 122, 166, 170, 184, 202, 266, 269; Pigment Orange Numbers 5, 16, 34, 36; Pigment Blue Numbers 15, 15:3, 15:4; Pigment Violet Numbers 3, 23, 27; and/or Pigment Green Number 7; combinations thereof, and the like. Inorganic pigments may be one of the following non-limiting pigments: iron oxides, titanium dioxides, chromium oxides, ferric ammonium ferrocyanides, ferric oxide blacks, Pigment Black Number 7 and/or Pigment White Numbers 6 and 7; combinations thereof, and the like. Other organic and inorganic pigments and dyes can also be employed, as well as combinations that achieve the colors desired. Colorants with a high heat resistance are preferred. Optical brighteners may also be used. Colorants may be included in the composition range of about 0.01% to about 50 wt. %. For example, colorants may be present in an amount of 0.05% to 40 wt. %; or from about 1% to about 30 wt. %. The dielectric layer may contain no colorants or fillers, consisting of a clear coating or a clear coating with an optical brightener or combination of optical brighteners.

In a preferred embodiment of the present invention, said composition further comprises: additives (leveling agents, antifoaming agent etc.) and fillers selected from various added dielectric materials e.g. silicon particles, organometallics, elastomers (e.g. copolyester, PMMA) and the like.

The dielectric ink or coating may also contain other additives to improve the rheology and printability of the coating. The dielectric coating may contain additives such as stabilizers and reactive enhancers. The consistency and rheology of the composition is adjusted to the particular method of application which may comprise screen printing, brushing, dipping, extrusion, spraying and the like.

In one embodiment, the flexible dielectric ink compositions described herein are applied by screen printing. The inks may be applied to an inert substrate, such as plastic, alumina, glass, ceramic, enamel, enamel-coated glass or metal substrate, to form a patterned layer.

In one embodiment, an alcohol soluble cellulose acetate butyrate is used as a rheology control agent. It has been found that when used in the ink compositions described herein, conventional cellulose esters provide many benefits, including improved hardness, improved silver flake orientation, high clarity, high gloss, decreased dry-to-touch time, improved flow and leveling, improved re-dissolve resistance, reduced cratering, and reduced blocking.

A grade of cellulose acetate butyrate e.g. Eastman CAB series components, hereinafter referred to as CAB give all above mentioned advantages. CAB has a butyryl content of about 45-50% by weight, a hydroxyl content of about 4-5% by weight. In addition, cellulose acetate phthalate, ethyl cellulose, hydroxypropylmethyl cellulose or cellulose triacetate, isopropyl myristate ("IPM"), caprylic/capric triglyceride, ethyl oleate, triethyl citrate, dimethyl phthalate or benzyl benzoate; the hydrophilic agent can comprise hydroxyethylcellulose ("HEC"), hydroxypropylcellulose, carboxymethylcellulose, polyethylene glycol or polyvinylpyrrolidone; may also be used as rheology modifying agent. Other viscosity modifiers include, but are not limited to, glycerol, glycols, stabilite, alkyl glycidyl ethers, ethyl cellulose, hydroxypropyl cellulose, butyl methacrylate, and feldspar. In one embodiment, 0.1 to 20 wt. % of CAB is added to the composition. For more consistent rheology, 0.5 to 8 wt. % of CAB is preferred.

Monomers and/or oligomers may also be present in the composition. For example, Silane monomers and/or oligomers can act as adhesion promoters and aid stretching characteristics. The silanes may include non-functional silanes and functionalized silanes including amino-functional, epoxy-functional, acrylate-functional and other functional silanes, which are known in the art. Suitable functionalized silanes include r-glycidoxypropyl-trimethoxysilane, γ-glycidoxypropyltriethoxysilane, glycidoxypropyl-methyldiethoxysilane, glycidoxypropyltrimethoxysilane, glycidoxypropyltriethoxysilane, glycidoxypropylmethyldimethoxysilane, glycidoxypropyl-methyldiethoxysilane, 5,6-epoxyhexyltriethoxysilane, epoxycyclohexylethyltrimethoxysilane, and the like. Other exemplary functionalized silanes include trimethoxysilylpropyldiethylene-triamine, N-methylaminopropyltrimethoxysilane, aminoethylaminopropyltrimethoxysilane, aminoethylaminopropylmethyldimethoxysilane, aminopropylmethyldimethoxysilane, aminopropyltrimethoxysilane, aminoethylaminoethylaminopropyl-trimethoxysilane, N-methylamino-propyltrimethoxysilane, methylaminopropyltrimethoxysilane, aminopropylmethyl-diethoxysilane, aminopropyltriethoxysilane, 4-aminobutyltriethoxysilane, oligomeric aminoalkylsilane, m-aminophenyltrimethoxysilane, phenylaminopropyltrimethoxysilane, aminoethylaminopropyltriethoxysilane, aminoethylaminoisobutylmethyldmethoxysilane, and the like. Additional suitable functional silanes include (3-acryloxypropyl)-trimethoxysilane, gamma-methacryloxypropyltrimethoxysilane, gamma-mercapto-propyltriethoxysilane, and olefinic silanes, such as vinyltrialkoxysilane, vinyltriacetoxysilane, alkylvinyldialkoxysilane, allyltrialkoxysilane, hexenyltrialkoxysilane and the like. Polymers bearing silicon group such as but not limited to poly (methyl siloxane), poly(dimethyl siloxane) and like may be used. BYK307, BYK310, BYK311, hexamethylene disiloxane and the like are preferred. Typical concentrations in the composition should not exceed 5%. In a preferred embodiment the concentration is in the range of about 0.1 to 3 wt. % of the formulation.

The dielectric ink or coating compositions described herein may also contain anti-foaming agents. Suitable anti-foaming agents include various silicone derivatives and may include other hydroxyfunctional polymers. Typical concentrations in the formulation should not exceed 5 wt. %. In a preferred embodiment the concentration is in the range of about 0.1 to 3 wt. % of the formulation.

In the art of preparation of nanocomposites, it is known that the addition of filler significantly enhances mechanical and tensile properties of the composites. A similar approach has been taken here. Fillers may be added to the composition to achieve desired stretch and bend properties of the final printed dielectric lines. Illustrative examples of fillers include, dielectric polymers such as poly(fluorenes), polystyrene, poly(ethyl-co-vinyl acetate) and like, inorganic fillers like quartz, graphene, graphene oxide, graphite and mixtures thereof.

The filler may be added directly or in solution. In a preferred embodiment, the filler is added as a dispersion. Blending with the dielectric composition without losing conductivity of the composition is critical. The concentration of fillers therefore, plays critical role. In one embodiment, 1 to 40 wt. % of fillers may be added. A preferred concentration is around 5 to 20 wt. % in the dielectric paste composition. In one embodiment, a polyaniline dispersion is used as a preferred filler. In another embodiment, graphene is dispersed in the dielectric composition.

The dielectric ink compositions described herein can be used in a process of making jettable inks for various applications. The composition can be cured at low temperature/low exposure times and has excellent adhesion on paper-phenolic resin board, plastic board (PMMA, PET or likes) and glass-epoxy resin board.

In one embodiment, the compositions described herein use unique amino and cellulose based organic binders that allow for stretching up to at least about 130%, more preferably at least about 140% without cracking. In some embodiments, the compositions are capable of stretching up to at least about 150%, and even up to about 160%. Stretch test was performed using bench vice (medium bench vice from McMaster) and heating the plastic film above the glass transition temperature (detailed method is given below in Examples). The compositions described herein are also fast and capable of low temperature curing. By "fast" what is meant is that the compositions are capable of curing in less than 45 minutes, preferably less than 30 minutes, and more preferably in less than about 20 minutes. By "low temperature," what is meant is a temperature that is less than about 100° C., more preferably less than about 90° ° C., more preferably less than about 80° C. For example, the dielectric ink composition may be capable of curing for 20 minutes at 70° C. in a thermal system and for 20 minutes at 0.5 J/cm$^2$ for a UV curable system. Thus, these inks are particularly suited for manufacturers with limited cure capacity.

These dielectric ink compositions are the most flexible compositions in the class and are also the most creasable. The compositions described herein are screen printable, stencil printable and allow for continuous printing without flooding. The ink compositions allow for high throughput. The compositions described herein are thermoformable/cold drawable and can be moulded to any shape/angles. The compositions have excellent continuity in all moulded shapes and allow for high volume resistivity. These compositions are compatible with commercially available silver traces and can be used in making cross over junction insulation layers.

These inks are compatible with commonly available silver and carbon inks. The inks are capable of stretching up to 130%, preferably up to 140%, more preferably up to about 150% and without loss of electrical continuity and provide high volume resistivity (in excess of 107 ohm-cm). These inventive inks can be thermoformed/cold draw at any depth or angle without losing line continuity and also have fast and low curing temperatures. It is also possible to carry out continuous printing without flooding.

The inventive inks offer improved electrical and mechanical properties and are stable at room temperature. The inventive inks can be used to mount components easily (e.g. in the manufacture of LEDs) and can be printed on any polymeric or other substrates with excellent adhesion. The compositions of the invention can be processed in a similar way to that of already printed inks.

The dielectric inks of this invention can be used to create a high quality IMD or IME part that contains a printed stack of mutually compatible layers that include graphic layers, conductive layers, and dielectric layers. In addition, the layers have similar elongation properties so that cracking and delaminating during the thermoforming process does not occur. In contrast, the prior art has not provided a comprehensive system of printable fluids that can work together in a printed stacked array to allow the formation of such complex devices without failures due to poor compatibility of functional layers and other material requirements of thermoforming and in-moulding. Dielectric ink compositions manufactured in the method described herein are fully compatible with the silver and carbon inks described in U.S. Pat. Pub. No. 2014/0151607, the subject matter of which is herein incorporated by reference in its entirety, and with most commercially available silver and carbon inks.

The embodiments described herein provide improved compositions and techniques for forming dielectric layers that may be thermal jet printed onto a substrate. The advantage of the inventive compositions and methods disclosed herein are that the compositions have enhanced stretching and forming properties and dielectric layers formed with the compositions have improved creasing and mechanical properties.

The method for forming the electronic circuits is not subject to any specific restrictions; the circuits can be formed by known methods, for example, screen printing the dielectric ink or using a computer-controlled drawing machine. Substrates such as a polyethylene terephthalate film, a polyimide film, a polyamide-imide film, a paper/phenol laminate, an epoxy/glass laminate, a polyimide/glass substrate and similar substrates can be used. The dielectric feature produced by the present process has, in certain embodiments, a high volume resistivity. The dielectric feature can be used as overprint on silver or carbon traces and protection for crossover junctions. The phrase "electronic device" refers to macro-, micro- and nano-electronic devices such as thin film transistor, organic light emitting diodes, RFID tags, photovoltaic, and other electronic devices which require dielectric elements or components. The dielectric feature can be any suitable thickness for the above applications. For example, the thickness is from about 5 nanometers to about 10 millimeters, from about 10 nanometers to about 5 millimeters, or from about 50 nm to about 1 millimeter.

In certain embodiments, the dielectric feature has high resistance. The resistance can be evaluated by measuring the breakdown voltage. The prescribed compositions have breakdown voltage in between 500 V and 1000 V. The flexibility of the composition may be defined as the ability of the printed structure to be able to undergo tensile stress of at least about 150% without cracking of the dielectric traces. Cracking may be observed under microscope of similar instrument at magnification of 50× or less. Similarly, the bending characteristic may be defined as ability of printed lines to undergo minimum of 10% strain at high temperature without the film cracking. Once printed, the substrate may undergo 3-D deformation and ink should be able to retain its continuity and other physical properties without getting delaminated. The printed substrate may undergo cold drawing, thermoforming, injection molding and similar three-dimensional deformation activities in order to produce components such as 3-D components for touch screen technologies. The inventive composition can withstand such operations without losing physical properties such as continuity or adhesion or line cracking.

The invention is further illustrated with reference to the following non-limiting examples.

Example 1: Thermally Curable Dielectric Ink

An organic medium for the composition of the invention was prepared as follows: 15 grams of a linear aromatic polyester resin (Dynapol, available from Evonik) was added to 170 grams of magnetically stirred carbitol acetate (boiling point 230° C.) and 40 g Dowanol EPh glycol ether (available from Dow Chemicals). A rheology modifier, resin and adhesion promoter were also added to the mixture. The mixture was heated to 60°C and stirred at this temperature until a clear solution was achieved (approximately 4 hours). The solution was allowed to cool slowly to ambient temperature.

The viscosity of the resulting dielectric ink composition after 24-hour ambient temperature rest was measured at about 12,000 centipoise (at 20° C.) on a Brookfield RVT viscometer, 5 rpm, No. 5 spindle. The dielectric ink composition was printed on a 100-micron thick electrical grade PET film through a 0.50 mil silk screen. The printed parts were dried in a laboratory air circulating oven at 120° for ten minutes to form dielectric interconnects. The resultant printed and dried element was tested for resistivity, adhesion (using cellophane tape sold as Scotch brand, #810), scratch resistance and stretching.

Resistivity was measured using a four-point probe method. The dielectric element was measured for resistivity, then folded in against itself and out against itself to create a crease perpendicular to a printed line. Resistivity was then re-measured.

Adhesion was measured with the switching element on a hard, flat surface, and a two-inch length of Scotch brand, #810 tape placed over approximately one inch of the printed conductor pattern. Smoothing pressure was applied with the fingers to insure good bonding of the tape adhesive to the dielectric element, then peeled back in an upward motion and checked for evidence of conductor transfer.

A fingernail scratch test was performed with the dielectric element on a hard, flat surface. The element was scratched several times with a fingernail at moderate pressure perpendicular to the printed conductor pattern and checked for evidence of conductor removal.

A stretch test was performed using bench vice (medium bench vice from McMaster). A printed substrate was fixed at both ends of the vice and an area to be tested was marked, and the typically marking is about 5 cm long. The test area was heated using an air gun at 150° C. and held for 60 seconds. The temperature was selected based on the glass transition temperature of the substrate. Typically, stretching is done at 10° C. above the glass transition temperature of substrate. The fixed printed substrate was slowly stretched to approx. 7 cm, i.e. 140% of the original length and was cooled and analyzed under the microscope at 50× for any cracks.

The results observed are set forth in the following Table 1. The data of Table 1 demonstrate that the dielectric element exhibited very good adhesion, flexibility, very good scratch resistance, good pencil hardness and acceptable resistivity after stretching and bending.

The same ink was overprinted on a compliant silver ink (SPS1501D, available from Alpha Assembly Solutions, Inc). The stack was dried and checked for similar tests as described above. In addition, breakdown voltage of the 25-micron film in a stack was also measured using a standard set up. In some experiments, dielectric ink can be printed on virgin plastic or graphic ink. Silver ink in these cases is sandwiched between the two dielectric layers.

TABLE 1

Test Results of Example 1

| Dry coating thickness Micron | Resistivity (Ω/sq/mil) | Cellophane tape adhesion | Pencil hardness | 140% Stretching characteristics | Breakdown voltage |
|---|---|---|---|---|---|
| 25 | >10,000 | Very good | 2 H | No cracking of line | 500 V |

Example 2

A dielectric ink was obtained by the same procedure described in Example 1 except that 250 parts by weight (25% by weight) of a talc powder with predominant particle size in the range from about one to about twenty microns, an average major particle diameter of 2 µm was blended and dispersed uniformly by a mixing and grinding machine and to obtain stretchable and formable dielectric ink. This composition also contained a polyester polyol.

Example 3

A dielectric ink was obtained by the same procedure described in Example 1, except that the composition used no solvents.

Example 4

A dielectric ink was obtained by the same procedure described in Example 1, except that the composition contained blocked a urethane isocyanate and a polyamine curing agent.

Example 5

A dielectric ink was obtained by the same procedure described in Example 2, except that the composition contained fumed silica particles.

Example 6

A dielectric ink was obtained by the same procedure described in Example 1, except that the composition contained an acrylic oligomer, a polyamine curing agent, and no solvents.

Example 7

A dielectric ink was obtained by the same procedure described in Example 1, except that the composition contained a bifunctional epoxy resin and a polyamine curing agent.

Example 8

A dielectric ink was obtained by the same procedure described in Example 1, except that the composition contained a bifunctional epoxy resin, a curing accelerator, a hardener and a polyamine curing agent.

Example 9: UV Curable Dielectric Ink Composition

A UV curable dielectric ink composition was prepared comprising:
about 20% to 80% by weight of a multifunctional urethane, epoxy, acrylate, vinyl, vinyl-ether and/or polyester polyol oligomer;
about 10% to 70% by weight of a monofunctional urethane, epoxy, acrylate, vinyl, vinyl-ether and/or polyester polyol oligomer; and
about 1% to 40% by weight of a difunctional urethane, epoxy, acrylate, vinyl, vinyl-ether and/or polyester polyol oligomer;
about 1% to 20% by weight of another crosslinker, comprising mainly melamine resins or difunctional (crosslinker) alkoxylated acrylate or diacrylate;
about 0.01 to 10% by weight a first photoinitiator for a first range of wavelength;
about 0.05 to 10% by weight of a second photoinitiator for a second range of wavelength; and
about 0.01 to 30% by weight of a rheology modifier, a solvent or wetting or flow or levelling promotor.

Example 10: UV Curable Dielectric Ink Composition

UV curable dielectric compositions were prepared as either solvent-borne or with no solvents.

A UV curable dielectric ink composition was prepared comprising:
about 20% to 80% by weight of a difunctional acrylate oligomer comprising a difunctional aliphatic or aromatic backbone,
about 10% to 70% by weight of a monofunctional acrylate monomer comprising 3,3,5-trimethylcyclohexyl acrylate, a methacrylate or acrylate ester.
about 1% to 20% by weight of a crosslinker comprising mainly melamine resins or difunctional alkoxylated acrylate or diacrylate,
about 0.01 to 10% by weight of a first photoinitiator for a first range of wavelength, about 0.05 to 10% by weight of a second photoinitiator for a second range of wavelengths, and about 0.01 to 10% by weight of a rheology modifier and wetting, flow and levelling promotor.

Example 11

UV curable dielectric ink compositions were prepared as either solvent-borne or with no solvents. An ink composition was prepared comprising all ingredients of Example 9, except for the inclusion of 1-50 percent by weight of a first solvent with boiling point range of 150-275° C. and 1-50 percent by weight of a second solvent with boiling point range of 100-200° C. were present.

Example 12

A dielectric ink was obtained by following the same process as in Example 9 except that the composition contained blocked polyurethane isocyanate and amine resin as backbone.

Example 13

A dielectric ink was obtained by following the same process as in Example 9 except that the composition contained talc as the dielectric filler particles.

Example 14

A dielectric ink was obtained by following the same process as in Example 9 except that the composition contained silica as the dielectric filler particles.

Example 15

A dielectric ink was obtained by following the same process as in Example 9 except that the composition contained titanium dioxide as the dielectric filler particles.

Ink compositions were printed on a polyethylene terephthalate (PET) and PC substrates and either cured in an air circulating ovens for few minutes or UV cured at 0.5 J/cm$^2$ light intensity. In some examples, dielectric compositions were printed on a compliant silver ink (SPS1501D, available from Alpha Assembly Solutions, Inc.) and/or carbon ink and cured.

The dielectric inks in these examples can be stencil printed or screen printed. The unique properties of the printed composition are that it has high throughput and can be printed without flooding. The dielectric ink also has very good compatibility with many commercially available silver inks. It also has compatibility with carbon overprint.

In the embodiment described herein, a DEK printer was used with 1 mil screen stencil for the application of ink. A thorough printing evaluation was conducted on ink. DEK03xi automated printed was used for the evaluation. Other parameters used are given in Table 3. Typically, silver conductive inks are printed on a PET substrate, dried/cured and then the dielectric layer was either underprinted or overprinted and cured. Sometime, the dielectric layer was printed on carbon traces.

TABLE 3

| Printing Parameters | |
|---|---|
| Test vehicle | PET/PC film |
| Screen | Mesh screen |
| Screen thickness | ~1-2 mil |
| Mesh/inch | 61/64 polyester |

Printing window optimization: A number of experiments were conducted to optimize printing window. The best results were obtained for Mesh Screen of the above size when printed at speed of 200 mm/sec and with induced pressure of 8.5 kg. All inks were evaluated under this condition. Images were taken for print uniformity and definition.

Stencil screen life: In order to determine the stencil life of the ink, it was kneaded continuously at 25° C. at room temperature. Brookfield viscosity measurements were taken periodically including T-0 (initial viscosity). Also, samples were printed at T0 and at end of the test in order to quantify printability and to track any changes in the ink's behavior over a period.

TABLE 2

Test Results for Examples 2-15

| Examples | Dry coating thickness Micron | Conductive ink compatibility | Cellophane tape adhesion | Pencil hardness | 140% Stretching characteristics | Thermoforming | Break down voltage (V) |
|---|---|---|---|---|---|---|---|
| 2 | 25 | Excellent | 5B | 2 H | No cracks | Possible | 1000 |
| 3 | 25 | Excellent | 5B | 2 H | No cracks | Possible | 500 |
| 4 | 25 | Excellent | 5B | 2 H | No cracks | Possible | 500 |
| 5 | 25 | Excellent | 5B | 2 H | No cracks | Possible | 500 |
| 6 | 25 | Excellent | 5B | 2 H | No cracks | Possible | 500 |
| 7 | 25 | Excellent | 5B | 2 H | No cracks | Possible | 1000 |
| 8 | 25 | Excellent | 5B | 2 H | No cracks | Possible | 1000 |
| 9 | 25 | Excellent | 5B | 2 H | No cracks | Possible | 500 |
| 10 | 25 | Excellent | 5B | 2 H | No cracks | Possible | 500 |
| 11 | 25 | Excellent | 5B | 2 H | No cracks | Possible | 1000 |
| 12 | 25 | Excellent | 5B | 2 H | No cracks | Possible | 1000 |
| 13 | 25 | Excellent | 5B | 2 H | No cracks | Possible | 1000 |
| 14 | 25 | Excellent | 5B | 2 H | No cracks | Possible | 1000 |
| 15 | 25 | Excellent | 5B | 2 H | No cracks | Possible | 1000 |

Response to pause: Ink was printed and kept open on the mesh for two hours. After two hours, printing characteristics of the opened ink were again evaluated to perform a response to pause test. The test is important as it reveals drying or other distortions in the ink rheology.

Continuous printing (without flooding): This test was performed to determine the drying effect of ink in the aperture after every print, without flooding the ink on stencil. To conduct this test, ink in jar was stirred for 30 seconds and applied on the stencil. This ink was printed on screen mesh with optimized print parameters, continuously up to 10 prints without flooding the ink after every print. Finally, the ink and printed lines were inspected for any print defects.

Optimized Printing Parameters were: Print Speed—200 mm/second, Pressure—13.5 Kg, Snap Off Speed—0.5 mm/second, Flood height: 3.5 mm, Printing process: Print and print.

Print Window Optimization: A print window optimization was carried out for a dense link of ink in accordance with Example 8 to identify the optimized printing window to achieve a defect free printing. A mesh screen with less than 1 mil thickness was used. The study was also conducted for benchmarked and other ink samples.

Print window was optimized at:
Print Speed—200 mm/Sec,
Pressure—15 Kg,
Snap Off Speed—0.5 mm/Sec,
Flood height: 3.5 mm,
Printing process: Print and Flood.

As shown in FIG. 1, the ink composition set forth in Example 8 was able to print at high speed thus giving high throughput. It was observed that material does not compact post curing, thus aperture height is a vital factor to be considered for ink deposit thickness. It is believed that the reason for non-compactness of the ink is that it is a curable compositions which does not have tendency to shrink.

Figure 2:
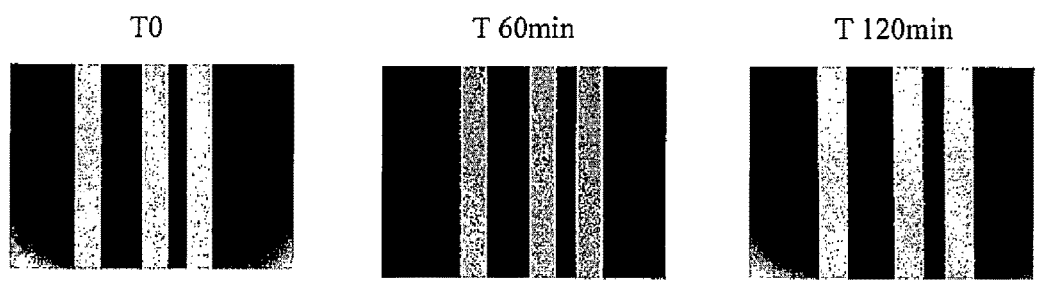
FIG. 2 depicts a comparison of printing without a pause to printing after a pause of 60 minutes and a pause of 120 minutes.

Response to Pause: PET films were printed with ink fresh out of the Jar (i.e., ink not kneaded) to provide a means of quantifying "out of jar performance." This test seeks to capture the initial performance by inspecting print deposits. The response to pause test provides information on how the ink responds to a pause in printing at different pause intervals. All of the ink described in the examples yielded good response to pause test. In all cases, no bridges or bleeding observed. Print definition was uniform and dense in all cases as shown in FIG. 2 which illustrates the ink fresh out of the jar (T0), at 60 minutes (T 60 min) and at 120 minute (t 120 min).

Figure 3:
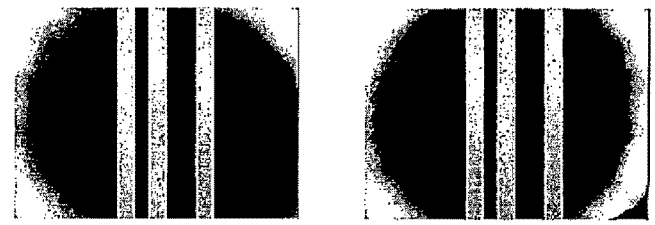
FIG. 3 depicts continuous print performance using the ink described in Example 5.

Continuous Print: This test was performed to evaluate the drying effect of ink in the aperture after every print, without flooding the ink on stencil. This test is important as it gives direct indication of throughput and material loss. Inks in this invention were able to give 10 prints without flooding. All commercial inks severely failed in this application. Due to the novel solvent and binder system, the dielectric inks described herein had a texture that was smooth and printed structures that did not have any porosity. The possibility of continuous printing is also due to novel solvent and rheology modifiers incorporated in the ink. FIG. 3 depicts the continuous printing performance of the dielectric ink of FIG. 5. As shown in FIG. 3, dense lines with no defects were observed, even after the 10th print.

Stencil Life: In order to determine the stencil life of the ink, it was kneaded continuously at 25° C. (room temperature). Brookfield viscosity measurements were taken every hour including T0. Also, a sample was printed at T0 and at end of the test in order to quantify printability and to track any changes in the ink's behavior over a period. This test provides an indication of how an ink performs on a stencil when kept open for long time or run continuously for longer time. All of the inks described herein showed excellent performance in this test, exhibiting a stencil life of at least four hours. No bubbling or abnormality in printing was observed. The printed ink exhibited smooth structure on the substrate and stencil life up to four hours. All inks performed well throughout four hours of stencil life. It was observed that the inks did not stick to the squeegee there was good rolling throughout four hours of kneading.

Table 4 sets forth a comparison of all of the printing inks described herein. All of these inks performed well in all printing tests. In contrast, prior art inks did not perform satisfactorily in continuous printing.

TABLE 4

Comparison of printing performance of all inks

| Tests | Properties of ink composition in this invention |
|---|---|
| Print window optimization | Mesh Screen Speed: 200 mm/sec Pressure: 13.5 kg Print and Flood |
| Response to pause | Up to 2 hours |
| No. of prints without flooding (Wipe frequency) | ≥20 |
| Ambient Temperature Viscosity | @ 0.5 RPM - 450% increase |
| Stencil Life Test Behavior | @ 5.0 RPM - 396% increase |
| Stencil life | Up to 4 hrs |

Thermoforming is a process in which a flat thermoplastic sheet is heated and deformed into the desired shape. Heating is usually accomplished by radiant electric heaters, located on one or both sides of the starting plastic sheet at a distance of roughly 125 mm (5 inches). The duration of the heating cycle needed to sufficiently soften the sheet depends on the polymer, its thickness and color. The methods by which the forming step is accomplished can be classified into three basic categories: (1) vacuum thermoforming, (2) pressure thermoforming, and (3) mechanical thermoforming. Line continuity, thermoformed object and overall performance of the ink was investigated using vacuum thermoforming. Printed inks and stacks (substrate+graphic ink+dielectric ink+silver traces+dielectric ink+barrier ink (optional)) were thermoformed using specific mold designs.

Once printed, the substrate may undergo 3-D deformation and the ink should be capable of retaining its continuity and other physical properties without getting delaminated. Printed substrate may undergo cold drawing, thermoforming and similar three dimension deformation activity in order to produce e.g. 3-D components for stretchable electronic surfaces. The important objective is to form an ink which can withstand such operations without losing physical properties such as resistivity or adhesion or line cracking. In this study inks were either cured at 120° C. for 10 minutes in an air circulating oven or were UV cured at 0.5 J/cm² power. A variety of substrates were used for this study. Forming requires specific substrates for specific applications. While PET is common in industry, PMMA (Poly(methyl methacrylate) and PC (Polycarbonate) are also sometime used. All three substrates were evaluated as set forth in Table 5.

TABLE 5

Various substrates and their properties for vacuum forming

| Base Material | Source | Thickness (μm) | Tg (° C.) | Ease of Forming |
|---|---|---|---|---|
| PET | McMaster, USA | 100 | 86 | Very Difficult |
| APET | Spearepet, | 200 | 80 | Easy |

TABLE 5-continued

Various substrates and their properties for vacuum forming

| Base Material | Source | Thickness (μm) | Tg (° C.) | Ease of Forming |
|---|---|---|---|---|
| (Vacuum Formable Grade) | India | | | |
| Hardcoat PET | Autotype UK | 1000 | 120 | Very Difficult |
| PMMA | Nudec, Spain | 1500 | 109 | Easy |
| Polycarbonate (PC) (hardcoat coated) | Autotype | 1000 | 147 | Easy |

As stated above, PET is widely used substrate. This substrate thermoforms at around 120-125° C. Various molds were custom made for thermoforming study. All of the dielectric ink compositions of the invention showed excellent results on polyester terephthalate (PET) and polycarbonate (PC) substrates.

Figure 4:
FIG. 4 depicts thermoformed objects printed using the ink composition of Example 5.
Figure 4:
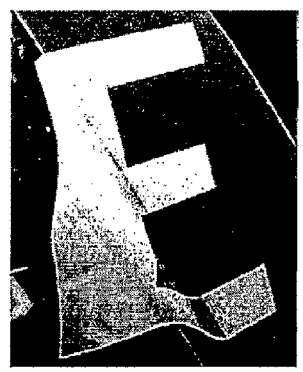
Figure 4:
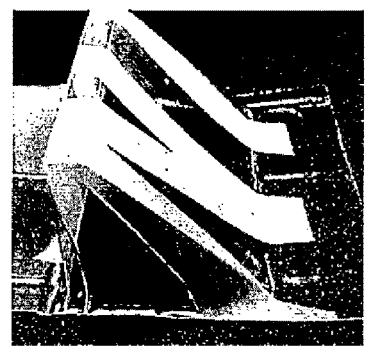
Figure 5:
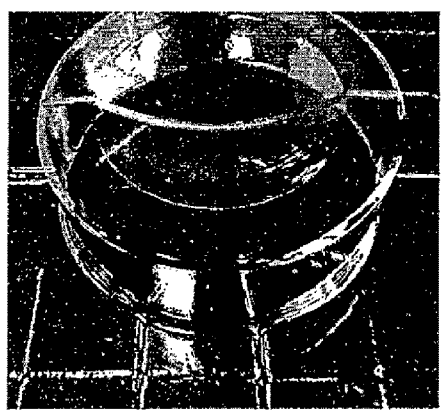
FIG. 5 depicts a thermoformed object using a conductive carbon and dielectric ink stack.
Figure 6:
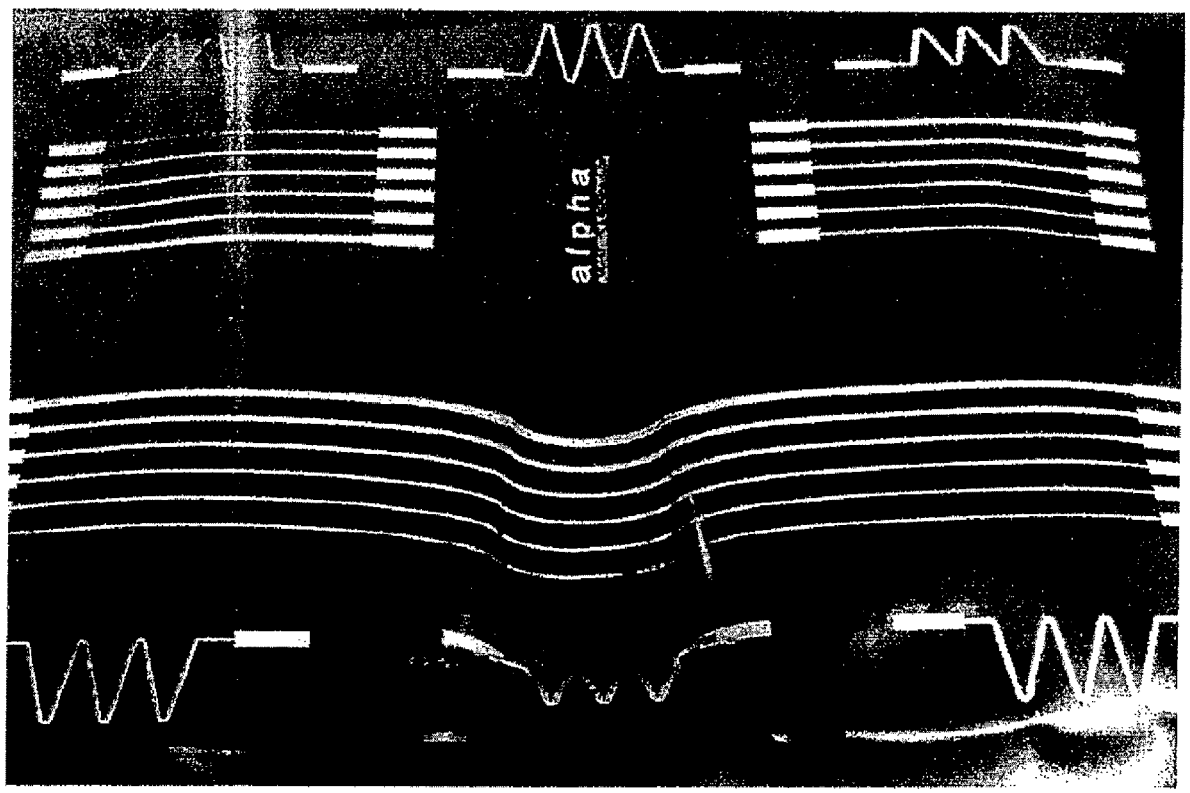
FIG. 6 depicts a molded thermoformed object manufactured in accordance with the present invention.

FIG. 4 depicts thermoformed objects using the ink composition of Example 5. FIG. 5 depicts a thermoformed object using a conductive carbon and dielectric stack using the ink composition of Example 5. FIG. 6 depicts a molded thermoformed object manufactured in accordance with present invention. For all of the thermoformed objects of FIGS. 4-6, no cracks were observed in microscopic images. In addition, the printed lines were continuous.

Finally, it should also be understood that the following claims are intended to cover all of the generic and specific features of the invention described herein and all statements of the scope of the invention that as a matter of language might fall there between.

The invention claimed is:

1. A method of forming a flexible dielectric ink, the method comprising:
    printing a stack comprising a first layer of the flexible dielectric ink composition, a second layer of a conductive ink, and a top layer of the flexible dielectric ink composition, wherein the flexible dielectric ink and the conductive ink are printed by jet printing, screen printing, or stencil printing;
    curing or drying the printed dielectric ink and conductive ink composition; and
    deforming the stack into a desired shape,
    wherein the flexible dielectric ink composition comprises:
    a dielectric material wherein the dielectric material is in the form of a powder, flakes, or resin;
    one or more or more organic binders;
    one or more UV-curable initiators, thermally curable initiators, crosslinking agents and/or drying agents; and
    at least one of:
    (a) one or more of an isoprene-based rubber, polybutene, polyisobutylene, a liquid silicone, a blocked polyisocyanate, or a long chain acrylic oligomer or polymer; and/or
    (b) one or more of a rheology modifier, an elastomer, an adhesion promoter, and a filler.

2. The method according to claim 1, wherein the forming step comprises thermoforming or vacuum forming and the desired shape comprises three-dimensional circuitry.

3. The method according to claim 1, wherein the first layer of the flexible dielectric ink composition is printed onto a flexible substrate.

4. The method according to claim 1, wherein the first layer of the flexible dielectric ink is printed over a conductive ink, graphic ink, or carbon traces that are printed on the substrate.

5. The method according to claim 1, wherein the dielectric material is selected from the group consisting of titanium dioxide, silica, fumed silica, polymer resins, polyamide waxes, micronized polyamide waxes, strontium titanate, talc, clays, polytetrafluoroethylene, polyparaxylene, monochloropolyparaxylene, dichloropoly-paraxylene, perfluoro-p-xylylene, and combinations of one or more of the foregoing.

6. The method according to claim 1, wherein the one or more organic binders are selected from the group consisting of polyester, polyamine, polyurethane, acrylate, polyol and combinations of one or more of the foregoing.

7. The method according to claim 1, further comprising an additional elastomer or oligomer.

8. The method according to claim 1, comprising the one or more of an isoprene-based rubber, polybutene, polyisobutylene, a liquid silicone, a blocked polyisocyanate, or a long chain acrylic oligomer or polymer.

9. The method according to claim 1, wherein the composition further comprises a solvent that has a boiling point between about 150 and 300° C.

10. The method according to claim 1, wherein the composition contains one or more UV-curable initiators, the one or more UV-curable initiators being selected from the group consisting of benzoin and its alkyl ethers, benzophenone and its derivatives, xanthone, thioxanthones, chlorinated thioxanthones, acetophenone derivatives, halogenated, aliphatic and aromatic polychlorinated biphenyls and polyphenyls, and combinations of one or more of the foregoing.

11. The method according to claim 1, wherein the composition contains one or more thermally curable initiators, the one or more thermally curable initiators being selected from the group consisting of melamine resins, polyfunctional aziridine compounds, isocyanates, zinc ammonium carbonate, zirconium carbonate, polyfunctional carbodiimide compounds, oxirane compounds, and combinations of one or more of the foregoing.

12. The method according to claim 1, wherein the composition comprises the one or more of a rheology modifier, an elastomer, an adhesion promoter, and a filler.

13. The method according to claim 12, wherein the composition comprising a filler selected from the group consisting of dielectric polymers, inorganic fillers, and combinations of one or more of the foregoing.

14. The method according to claim 13, wherein the filler is an inorganic filler selected from the group consisting of quartz, graphene, graphene oxide, graphite and combinations of one or more of the foregoing.

15. The method according to claim 13, wherein the filler is added in the form of a dispersion.

16. The method according to claim 12, wherein the composition comprises a rheology modifier, wherein the rheology modifier is an alcohol soluble cellulose acetate butyrate.

17. The method according to claim 12, wherein the composition comprises an adhesion promoter, wherein the adhesion promoter is a silane monomer or oligomer.

18. A method of making a capacitive touch component comprising:
    applying a dielectric ink composition onto a flexible substrate; and
    drying and/or curing the dielectric ink composition,
    wherein the dielectric ink composition comprises:
    a dielectric material wherein the dielectric material is in the form of a powder, flakes, or resin; and
    one or more or more organic binders;

one or more UV-curable initiators, thermally curable initiators, crosslinking agents and/or drying agents; and at least one of:
(a) one or more of an isoprene-based rubber, polybutene, polyisobutylene, a liquid silicone, a blocked polyisocyanate, or a long chain acrylic oligomer or polymer; and/or
(b) one or more of a rheology modifier, an elastomer, an adhesion promoter, and a filler.

19. The method of claim 18, wherein the flexible substrate is selected from the group consisting of polyethylene terephthalate, polycarbonate, and poly(methyl methacrylate).

20. A method of forming a component comprising a dielectric ink composition,
wherein the component is formed by a method selected from the group consisting of a thermoforming method, a cold drawing method, a method for the formation of 3D objects, screen printing, stencil printing, and a LED fabrication method, and
wherein the flexible dielectric ink composition comprises:
a dielectric material wherein the dielectric material is in the form of a powder, flakes, or resin;
one or more or more organic binders;
one or more UV-curable initiators, thermally curable initiators, crosslinking agents and/or drying agents; and
at least one of:
(a) one or more of an isoprene-based rubber, polybutene, polyisobutylene, a liquid silicone, a blocked polyisocyanate, or a long chain acrylic oligomer or polymer; and/or
(b) one or more of a rheology modifier, an elastomer, an adhesion promoter, and a filler.

21. An electronic component or device comprising a flexible dielectric ink composition,
wherein the flexible dielectric ink composition comprises:
a dielectric material wherein the dielectric material is in the form of a powder, flakes, or resin;
one or more or more organic binders;
one or more UV-curable initiators, thermally curable initiators, crosslinking agents and/or drying agents; and
at least one of:
(a) one or more of an isoprene-based rubber, polybutene, polyisobutylene, a liquid silicone, a blocked polyisocyanate, or a long chain acrylic oligomer or polymer; and/or
(b) one or more of a rheology modifier, an elastomer, an adhesion promoter, and a filler, and
wherein the electronic component or device comprises at least one selected from the group consisting of a printed electronic, RFID, biomedical, in-mold electronic, OLED lighting, LED lighting, heaters, touch panel, wearable, electroluminescent device, smart packaging, and photovoltaic.

22. A stack comprising a dielectric ink first layer, a conductive ink second layer, and a dielectric ink on the top,
wherein the flexible dielectric ink composition comprises:
a dielectric material wherein the dielectric material is in the form of a powder, flakes, or resin;
one or more or more organic binders;
one or more UV-curable initiators, thermally curable initiators, crosslinking agents and/or drying agents; and
at least one of:
(a) one or more of an isoprene-based rubber, polybutene, polyisobutylene, a liquid silicone, a blocked polyisocyanate, or a long chain acrylic oligomer or polymer; and/or
(b) one or more of a rheology modifier, an elastomer, an adhesion promoter, and a filler.

* * * * *